(12) United States Patent
Lee

(10) Patent No.: US 6,720,578 B2
(45) Date of Patent: Apr. 13, 2004

(54) POLYCRYSTALLINE SILICON THIN FILM FOR A THIN FILM TRANSISTOR AND DISPLAY DEVICE USING THE SAME

(75) Inventor: Ki-Yong Lee, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/298,571

(22) Filed: Nov. 19, 2002

(65) Prior Publication Data
US 2003/0141503 A1 Jul. 31, 2003

(30) Foreign Application Priority Data
Jan. 18, 2002 (KR) .......................................... 2002-3073

(51) Int. Cl.[7] .......................... H01L 29/04; H01L 29/76
(52) U.S. Cl. .............................. 257/64; 257/66; 257/49; 257/74; 257/75
(58) Field of Search ............................. 257/66, 64, 49, 257/74, 75

(56) References Cited

U.S. PATENT DOCUMENTS

| 6,177,301 B1 | 1/2001 | Jung | |
| 627,488 A1 * | 8/2001 | Suzuki et al. | 257/72 |
| 6,590,230 B1 * | 7/2003 | Yamazaki et al. | 257/72 |

FOREIGN PATENT DOCUMENTS

| JP | 3-292972 | * 12/1991 |
| WO | WO 97/45827 | 12/1997 |

* cited by examiner

Primary Examiner—George Eckert
Assistant Examiner—Joseph Nguyen
(74) Attorney, Agent, or Firm—Staas & Halsey LLP

(57) ABSTRACT

A polycrystalline silicon thin film for a TFT and a display device using the same where the number of crystal grain boundaries exerts a fatal influence on movement of electric charge carrier, providing a distance "S" between active channels of the TFT having dual or multiple channels with a relation $S=mGs \cdot sec\, \theta - L$, and also providing a display device in which uniformity of TFT characteristics is improved by synchronizing the number of the crystal grain boundaries included in each of the channels of the dual or multiple channels $$S = mGs \cdot sec\, \theta - L$$

Gs is a size of crystal grains of the polycrystalline silicon thin film, m is an integer of 1 or more, θ is an inclined angle where fatal crystal grain boundaries, that is, "primary" crystal grain boundaries are inclined in a direction perpendicular to an active channel direction, and L represents a length of active channels for each TFT having dual or multiple channels.

14 Claims, 9 Drawing Sheets

POLYCRYSTALLINE SILICON THIN FILM FOR A THIN FILM TRANSISTOR AND DISPLAY DEVICE USING THE SAME

CROSS-REFERENCE TO RELATED APPLICATIONS

This application claims the benefit of Korean Application No. 2002-3073, filed Jan. 18, 2002, in the Korean Industrial Property Office, the disclosure of which is incorporated herein by reference.

BACKGROUND OF THE INVENTION

1. Field of the Invention

The present invention relates to a polycrystalline silicon thin film for a thin film transistor and a display device using the same, and more particularly, to a polycrystalline silicon thin film for a thin film transistor with silicon grains in a crystal growing direction of which is constant and regularized, and a device using the thin film transistor fabricated using the polycrystalline silicon thin film.

2. Description of Related Art

Bonding defects, such as atom dangling bonds existing on the crystal grain boundaries of polycrystalline silicon included in an active channel region, are known to provide traps for electric charge carriers when fabricating a thin film transistor (TFT) substrate using polycrystalline silicon.

Therefore, size, size uniformity, number and position, and direction of the crystal grains not only directly or indirectly exert a fatal influence on TFT characteristics such as threshold voltage (Vth), subthreshold slope, charge carrier mobility, leakage current and device stability, but also exert a fatal influence on uniformity according to positions of the substrate when fabricating an active matrix display substrate using a TFT.

Particularly, uniformity in characteristics between TFTs is fatally influenced by the crystal grain boundaries, as the crystal grains are getting bigger and more regularized in order to improve TFT characteristics.

In the case of fabricating a TFT using polycrystalline silicon crystal grains having a size which is constant in the total or partial region on a TFT substrate or active matrix display, and a growing direction which is constantly regularized for an active channel direction, TFT characteristics might be superior when fabricating a TFT using a dual or multiple active channel having the same active channel length, since the number of crystal grain boundaries fatally influencing movement of the electric charge carrier are reduced as compared to when fabricating a TFT comprising a single active channel.

For example, when fabricating a TFT comprising a single active channel having a length 2L and a width W, using polycrystalline silicon having a crystal grain size Gs and an inclined angle of the fatal crystal grain boundaries θ, as illustrated in FIG. 1A, the number of the fatal crystal grain boundaries included in the active channel region is 3, and the total length of the channel is 2L. Conversely, the number of the fatal crystal grain boundaries included in each of the channel regions might be 2 or 1 for a TFT comprising multiple channels (FIG. 1B). Therefore, TFT characteristics will be improved as a whole when the fatal crystal grain boundaries acting as a barrier for movement of the electric charge carriers are decreased.

However, in a TFT fabricated using dual or multiple channels, the number of the fatal crystal grain boundaries included in each of the active channels can be varied depending on positions of the channel, but uniformity of the TFT may be deteriorated accordingly.

For example, as illustrated in FIG. 1B, one fatal crystal grain boundary is included in the first active channel while two fatal crystal grain boundaries are included in the second active channel.

In order to supplement the problems, it is reported in International Patent No. WO 97/45827 that polycrystalline or single crystalline large silicon grains can be formed on a substrate using crystallization technology of sequential lateral solidification (SLS) (FIG. 3), and characteristics which are second to characteristics of a TFT fabricated using single crystalline silicon can be obtained when fabricating a TFT using polycrystalline or single crystalline large silicon grains.

However, the SLS method of fabricating a TFT by forming single crystalline silicon has problems in that TFTs should be accurately aligned in an active channel region at positions where a plurality of TFTs on a substrate are technically difficult to fabricate, and a longer time is required in forming single crystalline silicon having a dimension corresponding to at least the active channel region, compared to when fabricating a TFT substrate using polycrystalline silicon.

A SLS method of fabricating a TFT using polycrystalline silicon is known to be superior to the SLS method of fabricating a TFT by forming single crystalline silicon. This is a reason that when the TFT is fabricated by the SLS using single crystalline silicon, it takes more time to fabricate the TFT than the SLS method of fabricating the TFT using polycrystalline silicon. Accordingly, in the aspect of commercial production, a throughput of the SLS method using single crystalline is decreased.

However, specific characteristics of a TFT using single crystalline silicon can be required in fabricating an active matrix display, such as characteristics requiring a completely built-in driver circuit as well as a circuit requiring a TFT of high characteristics, such as a digital to analog converter (DAC) circuit. When fabricating a TFT using polycrystalline silicon, several fatal crystal grain boundaries can be included in the active channel region according to the size of the crystal grains and the dimension of the active channel, deterioration of TFT characteristics can be predicted, and a completely built-in circuit can be insufficient, accordingly.

On the other hand, as disclosed in U.S. Pat. No. 6,177, 301, the barrier effect of the crystal grain boundaries for electric carriers is minimized, as illustrated in FIG. 4A, when a direction of the active channel in fabricating a TFT for liquid crystal display (LCD) devices comprising a driver and pixel array by forming large silicon grains using SLS crystallization technology, is parallel to a direction of crystal grains grown by the SLS crystallization method. Therefore, TFT characteristics which are second to characteristics of single crystalline silicon can be obtained although these characteristics are greatly deteriorated, as illustrated in FIG. 4B, since many crystal grain boundaries acting as traps for electric charge carriers exist where a direction of the active channel is perpendicular to a growing direction of the crystal grains.

There are cases where a TFT inside the driver circuit usually has an angle of 90 when actually fabricating an active matrix display, wherein uniformity of the device can be improved by slantingly fabricating the active matrix display in such a way that a direction of the active channel region is inclined at a growing angle of the crystal grains by an angle of 30 to 60° to improve uniformity between TFTs while not greatly deteriorating characteristics of each TFT, as illustrated in FIG. 4C.

However, several fatal crystal grain boundaries are included in the active channel region since the method also uses crystal grains of a limited size formed by the SLS crystallization technology. Therefore, the method is insufficient in built-in circuits requiring TFT characteristics which are equal to that of single crystalline silicon, and does not have accuracy equal to that capable of controlling the number of fatal crystal grain boundaries included in the active channel region. Accordingly, nonuniformity of the TFTs still exists.

SUMMARY OF THE INVENTION

Accordingly, it is an object of the present invention to provide a polycrystalline silicon thin film for a TFT capable of securing TFT characteristics by fabricating a TFT using dual or multiple active channels having equal active channel lengths when fabricating a TFT using polycrystalline silicon crystal grains having a size which is constant, and a growing direction which is constant and regularized in a direction of the active channels in the total region or partial region on a TFT substrate or an active matrix display, so that the number of crystal grain boundaries exerting fatal influence on movement of electric charge carriers is reduced, thereby simultaneously improving the TFT characteristics and synchronizing the number of crystal grain boundaries included in each of the channels of dual or multiple channels, and a display device using the polycrystalline silicon thin film for the TFT.

Additional objects and advantages of the invention will be set forth in part in the description which follows and, in part, will be obvious from the description, or may be learned by practice of the invention.

The foregoing and other objects of the present invention are achieved by providing a polycrystalline silicon thin film for TFTs where a distance "S" between active channels of each TFT comprising dual or multiple channels has a relation according to the following Equation:
Equation 1

$$S = mGs \cdot \sec\theta - L$$

where Gs is a size of crystal grains of the polycrystalline silicon thin film, m is an integer of 1 or more, θ is an inclined angle where fatal crystal grain boundaries, that is, "primary" crystal grain boundaries are inclined in a direction perpendicular to an active channel direction, and L represents a length of active channels for each TFT comprising dual or multiple channels.

The foregoing and other objects of the present invention may also be achieved by providing a display device fabricated using the polycrystalline silicon thin film for the TFTs.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF PREFERRED EMBODIMENTS

Figure 1A:
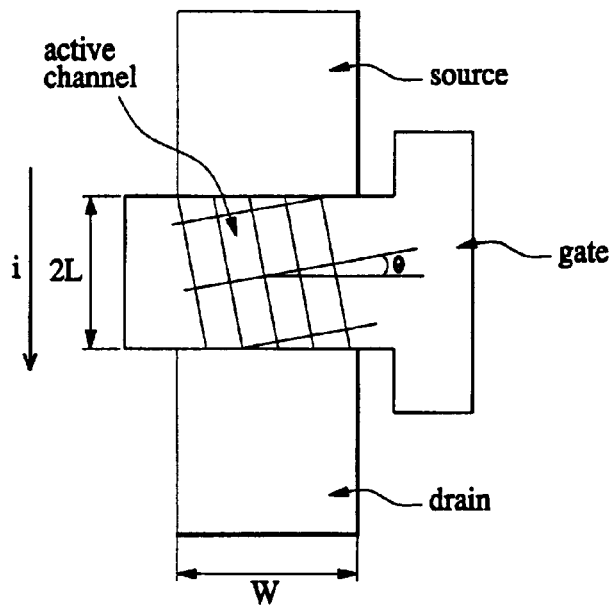
FIG. 1A is a cross-sectional view schematically illustrating a TFT comprising single active channels having an equal channel length 2L and a crystal grain size Gs.

Reference will now be made in detail to the embodiments of the present invention, examples of which are illustrated in the accompanying drawings, wherein like reference numerals refer to like elements throughout. The embodiments are described below in order to explain the present invention by referring to the figures.

A crystal grain boundary is formed between neighboring crystal grains due to a limited size of the crystal grains. Where crystal grains of polycrystalline silicon directly and indirectly exert important influence on TFT characteristics when fabricating a TFT for an active matrix display, they are enlarged and regularized to improve the TFT characteristics.

Figure 1B:
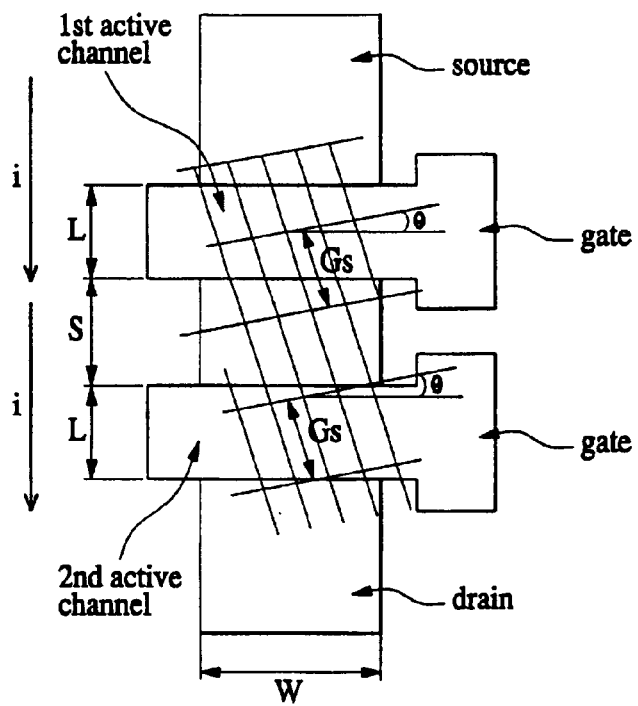
FIG. 1B is a cross-sectional view schematically illustrating a TFT comprising dual active channels.
Figure 2A:
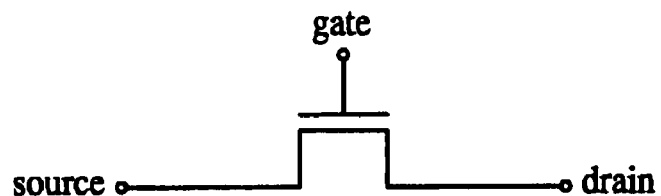
FIG. 2A is a conventional circuit configuration illustrating a single TFT.
Figure 2B:
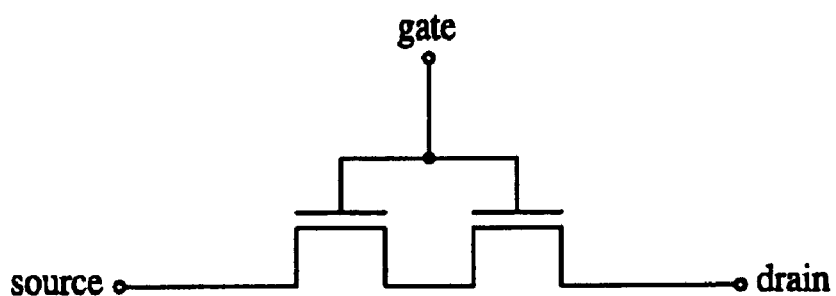
FIG. 2B is a conventional circuit configuration illustrating a TFT comprising a dual TFT connected to a common electrode.
Figure 3A:
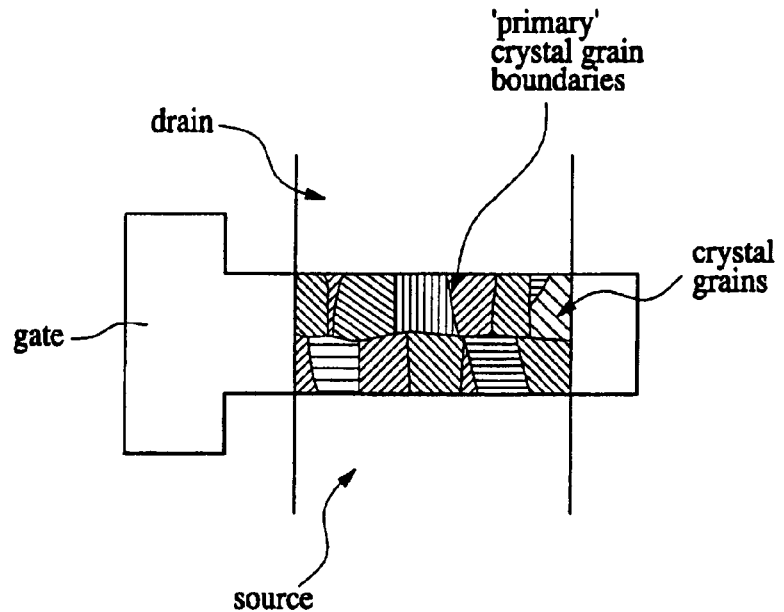
FIG. 3A and FIG. 3B are cross-sectional views schematically illustrating conventional active channels including large silicon grains formed by sequential lateral solidification (SLS) crystallization.
Figure 3B:
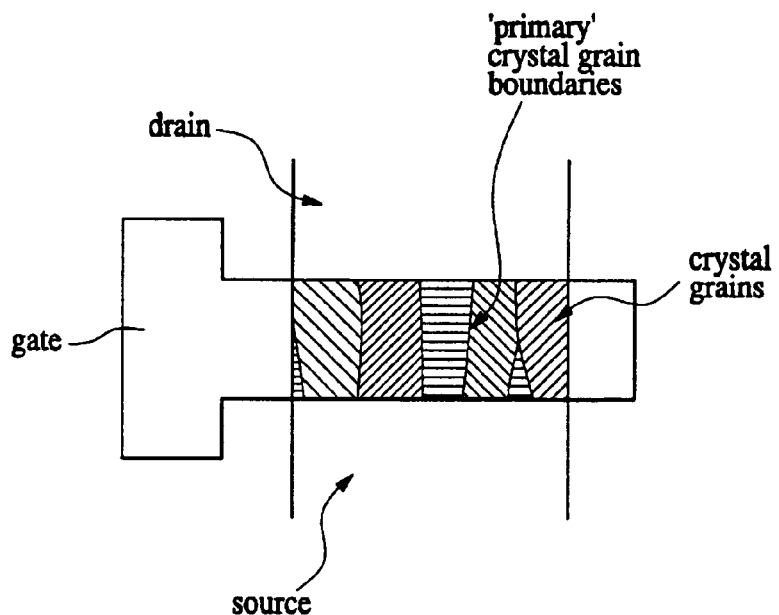
Figure 4A:
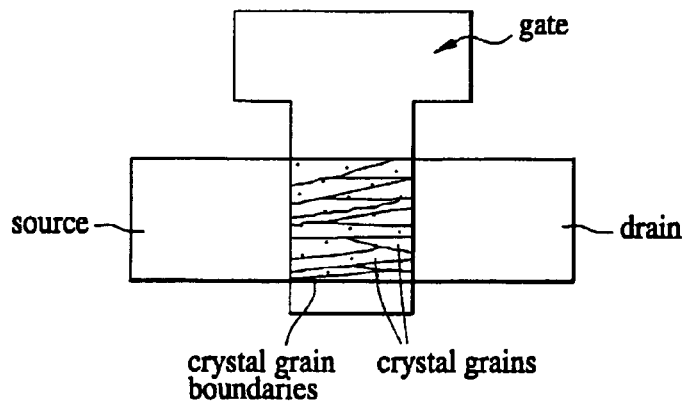
FIG. 4A to FIG. 4C are more cross-sectional views schematically illustrating conventional active channels including large silicon grains formed by SLS crystallization.
Figure 4B:
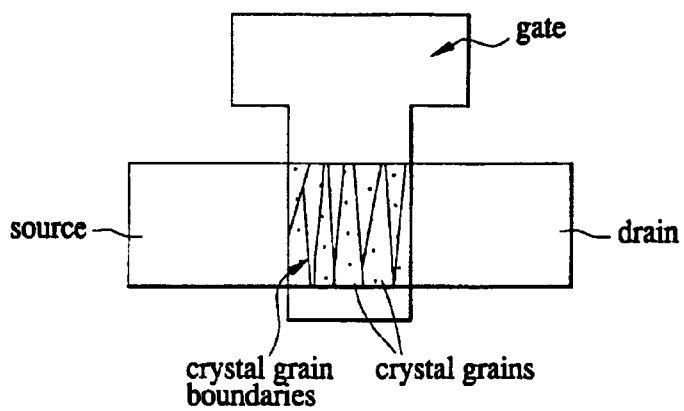
Figure 4C:
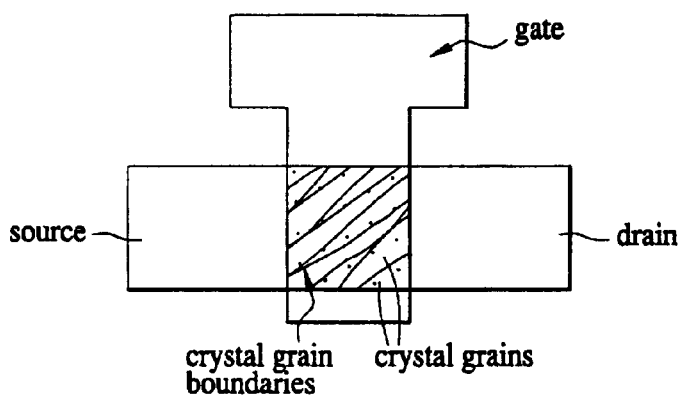

A crystal grain boundary exerting a fatal influence on TFT characteristics when the crystal grain boundary exists in an active channel region, particularly, a "primary" crystal grain boundary in which an inclined angle of the crystal grain boundary in a direction perpendicular to an active channel direction is $-45° \leq \theta \leq 45°$, as illustrated in FIG. 1A and FIG. 1B, contains inevitable defects due to the limit of processing accuracy during formation of a polycrystalline silicon thin film. Further, the number of the "primary" crystal grain boundaries included in a TFT active channel region fabricated on a substrate or display may be variable depending on the size and direction of the crystal grains, and also depending on the dimension of the active channels, as illustrated in FIG. 4A to FIG. 4C.

A size of the crystal grains that can be grown during formation of polycrystalline silicon is not only limited depending on thin film characteristics or thin film thickness according to formation methods of amorphous silicon, such as plasma enhanced chemical vapor deposition (PECVD), low pressure chemical vapor deposition (LPCVD) and sputtering, but is also directly influenced by the crystallization technology of phase-transforming the amorphous silicon into crystalline silicon.

For example, a maximum size of crystal grains that can be grown is determined by energy density, pulse duration, substrate conductivity and substrate temperature during silicon crystallization using laser energy (e.g. excimer laser annealing).

Figure 5A:
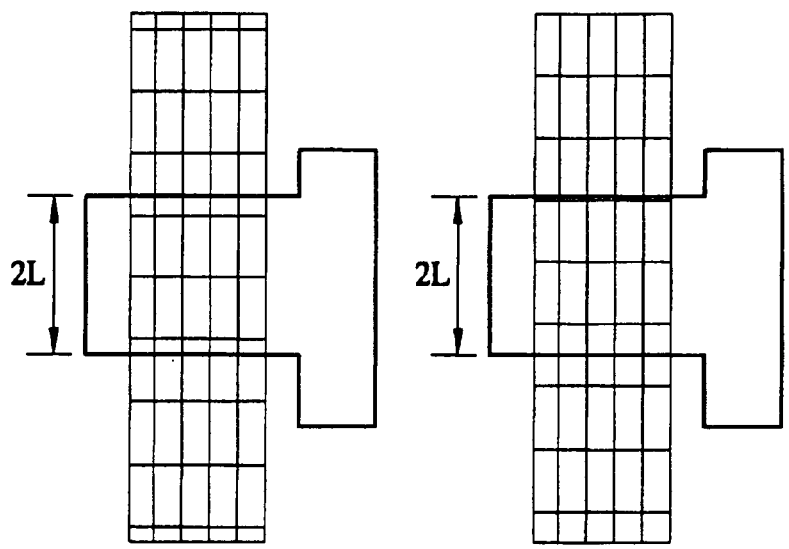
FIG. 5A to FIG. 5C are cross-sectional views schematically illustrating a single channel TFT and dual channels TFT using a size of crystal grains and a dimension of active channels given when θ=0° according to an embodiment of the present invention.

Furthermore, an active channel dimension of a TFT used in an active matrix display is frequently larger than the size of the crystal grains. Accordingly, a fatal crystal grain boundary exerting an influence on TFT characteristics often exists in the active channel region, and TFT characteristics using polycrystalline silicon can be greatly deteriorated compared to TFT characteristics using single crystalline silicon, as illustrated in FIG. 5A.

Figure 5B:
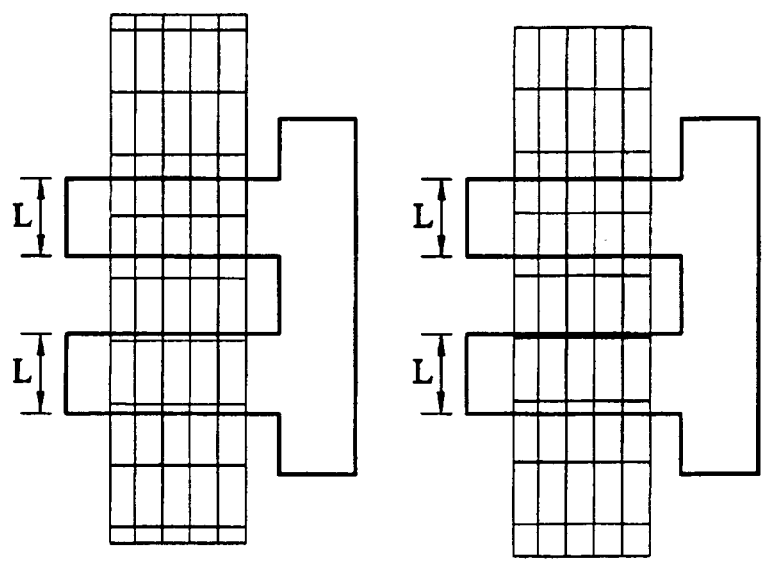

However, TFT characteristics can be improved, as illustrated in FIG. 5B, since the number of fatal crystal grain boundaries included in each of the channels is decreased by fabricating a TFT using dual gates or multiple gates to form dual or multiple channels having a length of 2L.

However, in the case of fabricating a TFT using dual gates or multiple gates, the number of fatal crystal grain boundaries included in each of the active channels varies depending on a size of crystal grains and a dimension of the active channels, as illustrated in FIG. 5B, thus causing non-uniform TFT characteristics.

Figure 5C:
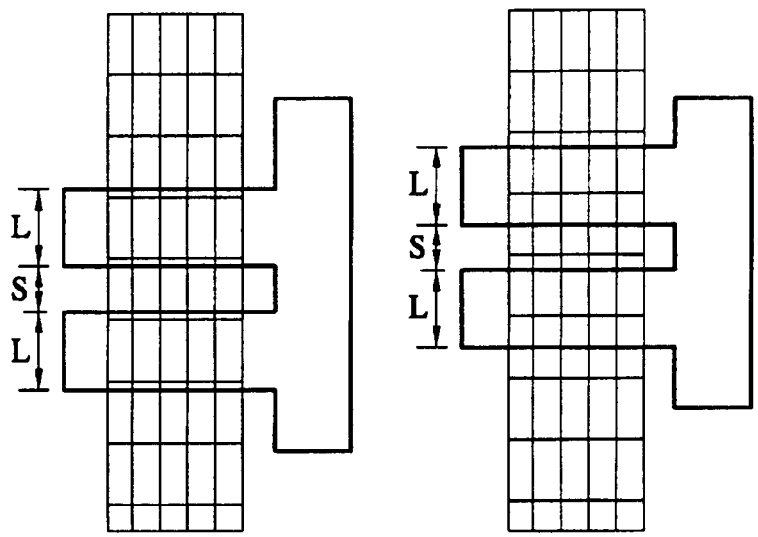

In order to address these problems, the present invention provides that the number of fatal crystal grain boundaries included in neighboring active channels can be equalized so that the same characteristics can be obtained, as illustrated in FIG. 5C, when a distance between the dual gates or multiple gates is a multiple integer of a specific distance "S," or more preferably, when the distance between the dual gates or multiple gates is the same as the distance "S."

In the present invention, "a size of crystal grains" means a specific distance between crystal grain boundaries, and is defined as a distance of the crystal grain boundaries within an ordinary error range.

Figure 6A:
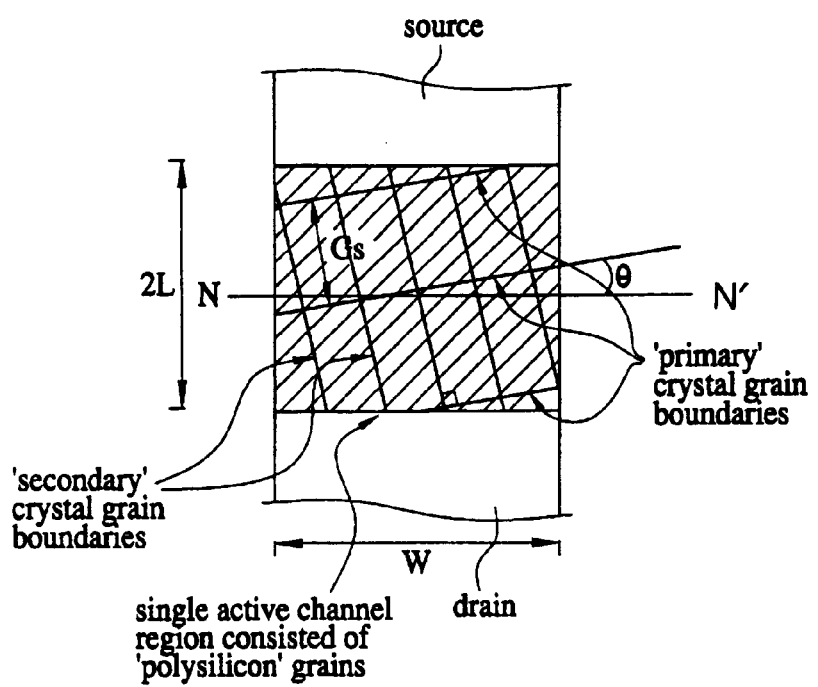
FIG. 6A is a cross-sectional view schematically illustrating a single gate in which a length of active channels is 2L according to an embodiment of the present invention.
Figure 6B:
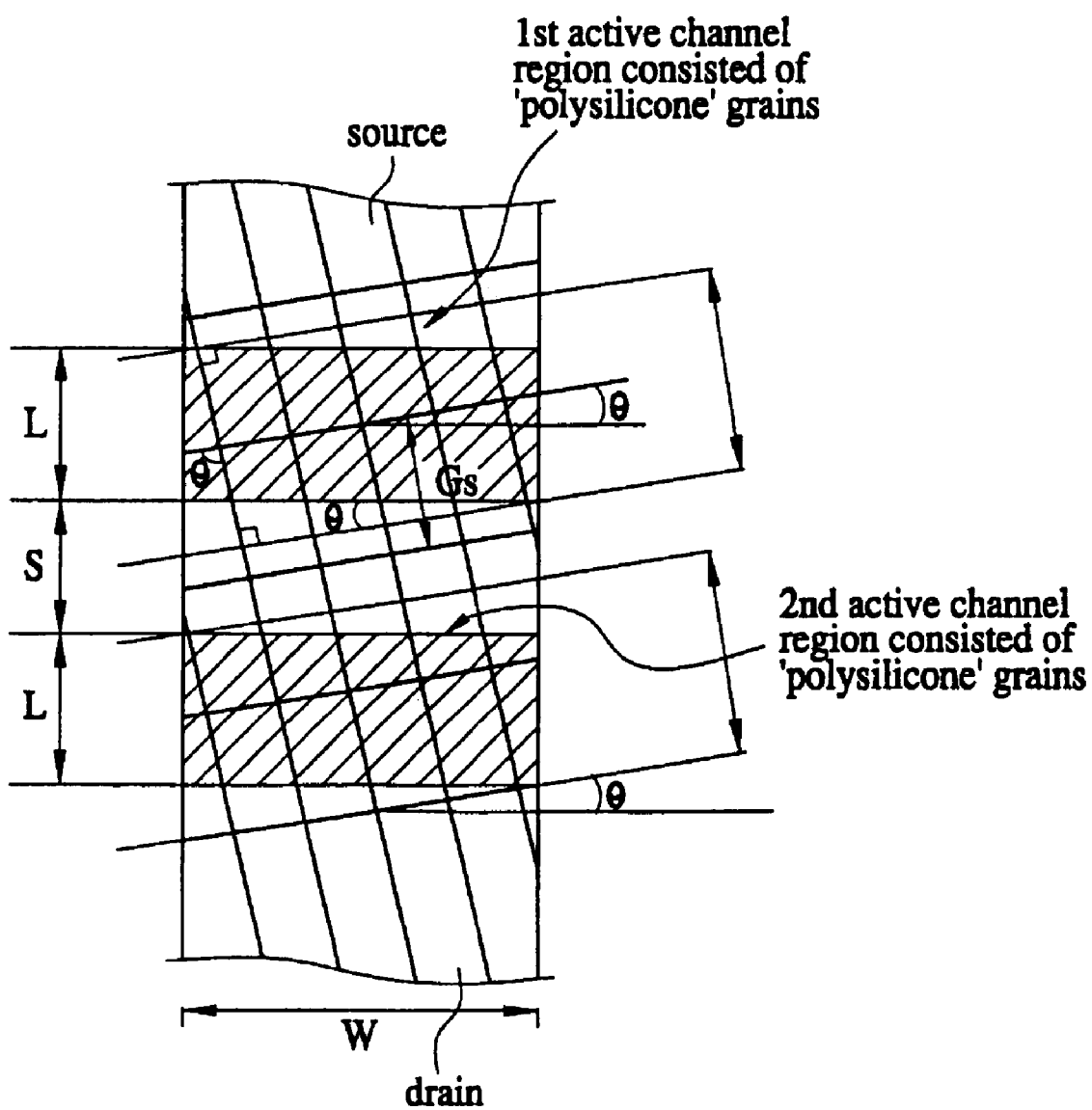
FIG. 6B is a cross-sectional view schematically illustrating a dual gate according to an embodiment of the present invention.

In the present invention, if a normal line for a source/drain direction is NN', a crystal grain boundary forming an angle $\theta$ of $-45° \leq \theta \leq 45°$ with NN' can have fatal influence on movement of electric charge carriers, and the crystal grain boundary is defined as a "primary" crystal grain boundary, as illustrated in FIG. 6A and FIG. 6B.

Figure 7:
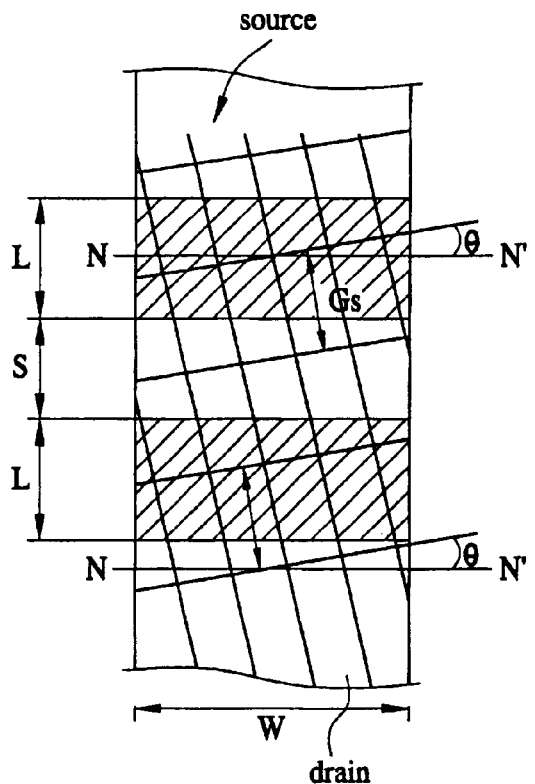
FIG. 7 is a cross-sectional view schematically illustrating a dual gate TFT used to calculate Expression 1 defined in the present invention.

A distance perpendicular to the "primary" crystal grain boundary for an active channel region having a length L and a width W, that is, a maximum distance in the active channel region D, can be represented as follows by a simple trigonometrical function, as illustrated in FIG. 7.

$$D=(L+x) \times \cos \theta, \text{ where } x=W \tan \theta,$$

Therefore, $D=(L+W \tan \theta) \times \cos \theta=L \cos \theta+W \tan \theta \times \cos \theta$, and $D=L \cos \theta+W \sin \theta$ since $\tan \theta \times \cos \theta$ is $\sin \theta$. That is, D can be represented by functions of a length L and a width W of the active channel region, and an inclined angle $\theta$ of the "primary" crystal grain boundary for the normal line NN'.

When $\theta=0°$, D is no longer a function of a width W of the active channel region and an inclined angle $\theta$ of the "primary" crystal grain boundary for the normal line NN', since D=L.

Figure 8:
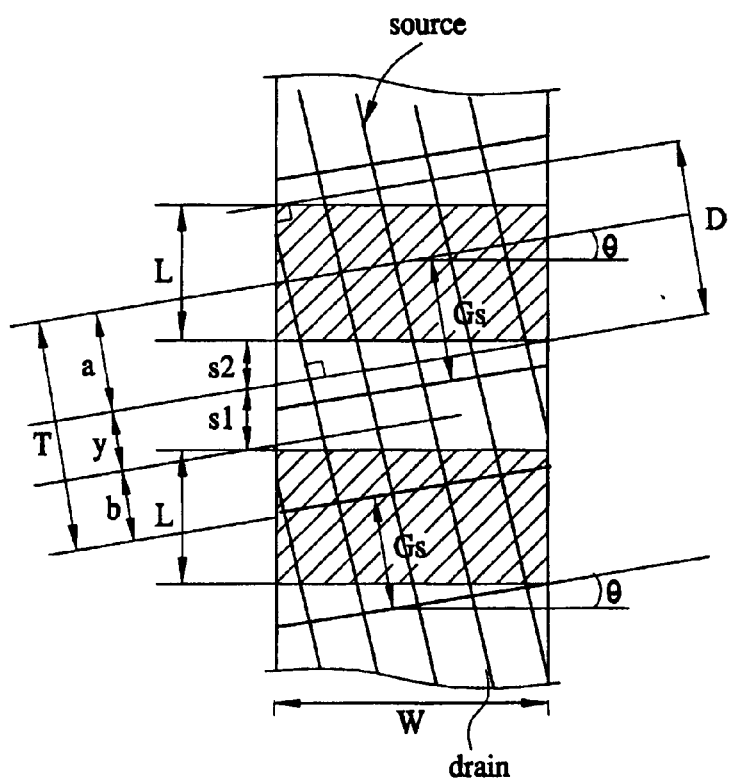
FIG. 8 is a schematic cross-sectional view illustrating conditions for synchronization of a dual gate TFT according to an embodiment of the present invention.

It can be easily understood from FIG. 8 that synchronization conditions to fabricate a TFT so as to equalize the number of the "primary" crystal grain boundaries in two active channel regions is D=a+b.

In FIG. 8, if a distance from a first "primary" crystal grain boundary of the upper part inside a first active channel region to a first "primary" crystal grain boundary of the upper part inside a second active channel region is T, it can be represented as T=a+y+b=D+y, and if a size of the crystal grains is Gs, a length of the crystal grains T can be represented as T=mGs, wherein m is an integer of 1 or more. Therefore, if solving for y by equally solving for T, then the following equation y=mGs−D holds true, wherein if a distance "S" between dual channels for synchronization is represented as S=s1+s2, as illustrated in FIG. 8, it can be seen from the simple trigonometric function that s1=y sec $\theta$, and s2=W tan $\theta$. Therefore, as S=s1+s2=x sec $\theta$+W tan $\theta$=(mGs−D) sec $\theta$+W tan $\theta$=mGs sec $\theta$−D sec $\theta$+W tan $\theta$, and D=L cos $\theta$+W sin $\theta$, S can be represented as S=mGs sec $\theta$−L−W tan $\theta$+W tan $\theta$.

Therefore, a distance S between the channels to synchronize the "primary" crystal grain boundaries included in each of the active channels in a TFT using dual gates or multiple gates can be represented by the following equation.

Equation 1:

$$(S=mGs \sec \theta-L);$$

where Gs is a size of crystal grains, m is an integer of 1 or more, $\theta$ is an inclined angle where fatal crystal grain boundaries, that is, "primary" crystal grain boundaries are inclined in a direction perpendicular to an active channel direction, and L is a length of active channels for each TFT comprising dual or multiple channels.

Furthermore, the distance S always should be S>0 so that the distance S is defined as dual gates or multiple gates having a physical distance, and therefore, the value of m for synchronization can be determined.

In the case of $\theta=0°$

Figure 9A:
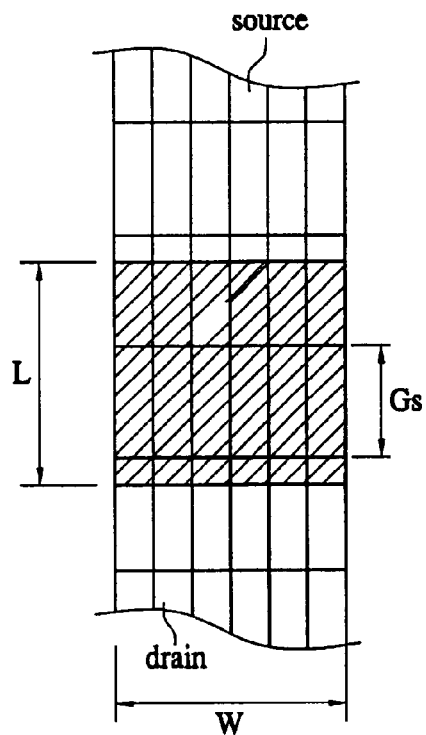
FIG. 9A is a cross-sectional view schematically illustrating a single gate TFT in the case where θ=0°.
Figure 9B:
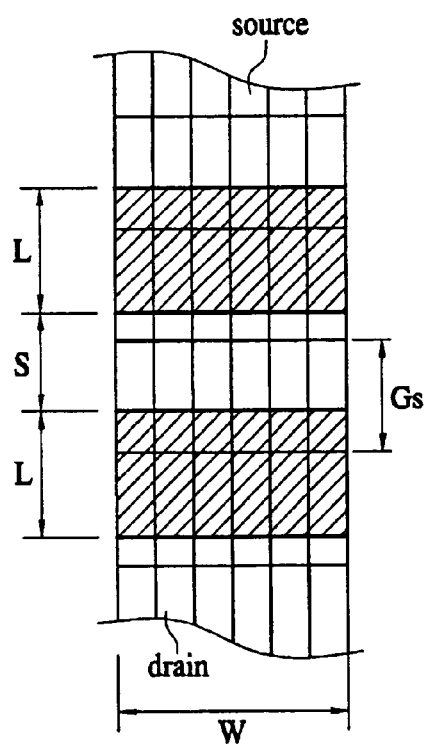
FIG. 9B is a cross-sectional view schematically illustrating a dual gate TFT according to an embodiment of the present invention.

It can be easily determined that TFT characteristics are superior when "primary" crystal grain boundaries, having a fatal influence on the TFT characteristics, are perpendicular to (that is, $\theta=0°$) an electric charge carrier direction, as illustrated in FIG. 9A and FIG. 9B, compared to when $\theta \neq 0°$, since the influence exerted on the TFT characteristics by "secondary" crystal grain boundaries perpendicular to the "primary" crystal grain boundaries is decreased. Furthermore, in the case of a TFT comprising dual gates or multiple gates having an equal channel length, uniformity can be obtained by synchronizing the number of the "primary" crystal grain boundaries included in each channel region.

Therefore, in the case that $\theta=0°$, it can be understood that S=mGs−L.

On the other hand, when fabricating a dual gate TFT using a single gate TFT having the total channel length 2L where an inclined angle $\theta$ and a crystal grain size Gs are given, a distance S between the channels to synchronize the number of "primary" crystal grain boundaries included in two active channel regions having a length L of each channel is obtained and represented as provided in Table 1 below.

Each two values out of synchronous m values and S values according to the m values are offered starting from the smaller values. It can be seen from Expression 1 and Table 1 that a larger S value can be obtained by adding as much as a crystal grain size Gs to an S value.

TABLE 1

Probability P is a maximum number Nmax of crystal grain boundaries included in active channel regions according to a channel length L where a crystal grain size is Gs, an angle is θ, and W = 10 μm.

| Θ | Gs(□) | L(□) | m | S |
|---|---|---|---|---|
| 0° | 0.4 | 1 | 3 | 0.2 |
|  |  |  | 4 | 0.6 |
|  |  | 2 | 6 | 0.4 |
|  |  |  | 7 | 0.8 |
|  |  | 3 | 8 | 0.2 |
|  |  |  | 9 | 0.6 |
|  |  | 4 | 11 | 0.4 |
|  |  |  | 12 | 0.8 |
|  |  | 5 | 13 | 0.2 |
|  |  |  | 14 | 0.6 |
|  | 1.5 | 1 | 1 | 0.5 |
|  |  |  | 2 | 2 |
|  |  | 2 | 2 | 1 |
|  |  |  | 3 | 2.5 |
|  |  | 3 | 3 | 1.5 |
|  |  |  | 4 | 3 |
|  |  | 4 | 3 | 0.5 |
|  |  |  | 4 | 2 |
|  |  | 5 | 4 | 1 |
|  |  |  | 5 | 2.5 |
|  | 2.5 | 1 | 1 | 1.5 |
|  |  |  | 2 | 4 |
|  |  | 2 | 1 | 0.5 |
|  |  |  | 2 | 3 |
|  |  | 3 | 2 | 2 |
|  |  |  | 3 | 4.5 |
|  |  | 4 | 2 | 1 |
|  |  |  | 3 | 3.5 |
|  |  | 5 | 3 | 2.5 |
|  |  |  | 4 | 5 |
| 2° | 0.4 | 1 | 3 | 0.089 |
|  |  |  | 4 | 0.489 |
|  |  | 2 | 6 | 0.289 |
|  |  |  | 7 | 0.689 |
|  |  | 3 | 8 | 0.089 |
|  |  |  | 9 | 0.489 |
|  |  | 4 | 11 | 0.289 |
|  |  |  | 12 | 0.689 |
|  |  | 5 | 13 | 0.09 |
|  |  |  | 14 | 0.49 |
|  | 1.5 | 1 | 1 | 0.389 |
|  |  |  | 2 | 1.889 |
|  |  | 2 | 2 | 0.889 |
|  |  |  | 3 | 2.389 |
|  |  | 3 | 3 | 1.389 |
|  |  |  | 4 | 2.889 |
|  |  | 4 | 3 | 0.389 |
|  |  |  | 4 | 1.87 |
|  |  | 5 | 4 | 0.89 |
|  |  |  | 5 | 2.39 |
|  | 2.5 | 1 | 1 | 1.389 |
|  |  |  | 2 | 3.889 |
|  |  | 2 | 1 | 0.389 |
|  |  |  | 2 | 2.889 |
|  |  | 3 | 2 | 1.889 |
|  |  |  | 3 | 4.39 |
|  |  | 4 | 2 | 0.889 |
|  |  |  | 3 | 3.39 |
|  |  | 5 | 3 | 2.39 |
|  |  |  | 4 | 4.89 |
| 5° | 0.4 | 1 | 3 | 0.323 |
|  |  |  | 4 | 0.723 |
|  |  | 2 | 6 | 0.124 |
|  |  |  | 7 | 0.524 |
|  |  | 3 | 8 | 0.325 |
|  |  |  | 9 | 0.725 |
|  |  | 4 | 11 | 0.125 |
|  |  |  | 12 | 0.525 |
|  |  | 5 | 13 | 0.326 |
|  |  |  | 14 | 0.727 |
|  | 1.5 | 1 | 1 | 0.223 |
|  |  |  | 2 | 1.724 |
|  |  | 2 | 2 | 0.724 |

TABLE 1-continued

Probability P is a maximum number Nmax of crystal grain boundaries included in active channel regions according to a channel length L where a crystal grain size is Gs, an angle is θ, and W = 10 μm.

| Θ | Gs(□) | L(□) | m | S |
|---|---|---|---|---|
|  |  |  | 3 | 2.225 |
|  |  | 3 | 3 | 1.225 |
|  |  |  | 4 | 2.726 |
|  |  | 4 | 3 | 0.226 |
|  |  |  | 4 | 1.726 |
|  |  | 5 | 4 | 0.727 |
|  |  |  | 5 | 2.227 |
|  | 2.5 | 1 | 1 | 1.224 |
|  |  |  | 2 | 3.725 |
|  |  | 2 | 1 | 0.224 |
|  |  |  | 2 | 2.725 |
|  |  | 3 | 2 | 1.725 |
|  |  |  | 3 | 4.226 |
|  |  | 4 | 2 | 0.726 |
|  |  |  | 3 | 3.227 |
|  |  | 5 | 3 | 2.227 |
|  |  |  | 4 | 4.728 |

In the present invention, TFT characteristics are more preferable where an inclined angle of the crystal grain boundaries is $-5° \leq \theta \leq 5°$.

TFT characteristics can become superior since the number of crystal grain boundaries exerting fatal influence on movement of electric charge carriers is reduced when fabricating a TFT using dual or multiple active channels having an equal active channel length, compared to when a TFT comprising a single active channel is fabricated using polycrystalline silicon crystal grains having a size which is constant in the total region or partial region on a TFT substrate or an active matrix display, and a growing direction which is constant and regularized in an active channel direction. Furthermore, uniformity of a TFT can be improved by synchronizing the number of fatal crystal grain boundaries included in each channel region of dual or multiple active channels when designing a TFT using a numerical formula defined in the present invention.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A polycrystalline silicon thin film for a TFT having a distance "S" between active channels of the TFT comprising:

dual or multiple channels having a relation according to the expression:

$$S = mGs \cdot \sec \theta - L,$$

where Gs is a size of crystal grains of the polycrystalline silicon thin film, m is an integer of 1 or more, θ is an inclined angle where fatal crystal grain boundaries are inclined in a direction perpendicular to an active channel direction, and L represents a length of active channels for each TFT comprising dual or multiple channels.

2. The polycrystalline silicon thin film for the TFT of claim 1, wherein the distance between the dual or multiple channels is a multiple integer of "S" when θ is 0°.

3. The polycrystalline silicon thin film for the TFT of claim 2, wherein the distance between the dual or multiple channels is the same as "S" when θ is 0°.

4. The polycrystalline silicon thin film for the TFT of claim 1, wherein the polycrystalline silicon film is formed on a total area of a substrate of a display device or a partial area of the substrate of the display device.

5. The polycrystalline silicon thin film for the TFT of claim 1, wherein the size of the crystal grains is 0.2 μm or more.

6. The polycrystalline silicon thin film for the TFT of claim 1, wherein two or more crystal grains are arranged on a substrate of the TFT.

7. The polycrystalline silicon thin film for the TFT of claim 1, wherein the inclined angle of the fatal crystal grain boundaries is $-45° \leq \theta \leq 45°$.

8. The polycrystalline silicon thin film for the TFT of claim 7, wherein the inclined angle of the fatal crystal grain boundaries is $-5° \leq \theta \leq 5°$.

9. The polycrystalline silicon thin film for the TFT of claim 1, wherein the length of the active channels is a multiple integer of the size of the crystal grains.

10. The polycrystalline silicon thin film for the TFT of claim 1, wherein the number of the crystal grains inside the display is two or more.

11. The polycrystalline silicon thin film for the TFT of claim 1, wherein the crystal grains are grown in a constant direction.

12. The polycrystalline silicon thin film for the TFT of claim 1, wherein the crystalline silicon film is formed by crystallizing amorphous silicon grown using a method selected from plasma enhanced chemical vapor deposition (PECVD), low pressure chemical vapor deposition (LPCVD) and sputtering in excimer laser annealing.

13. A display device having a TFT which is fabricated using the polycrystalline thin film of claim 1.

14. The device of claim 13, wherein the display device is a liquid crystal display or an organic electroluminescent device.

* * * * *